(12) United States Patent
Ito et al.

(10) Patent No.: US 7,868,450 B2
(45) Date of Patent: Jan. 11, 2011

(54) SEMICONDUCTOR PACKAGE

(75) Inventors: Seiji Ito, Kawasaki (JP); Tsuyoshi Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 12/186,129

(22) Filed: Aug. 5, 2008

(65) Prior Publication Data

US 2009/0039500 A1 Feb. 12, 2009

(30) Foreign Application Priority Data

Aug. 7, 2007 (JP) ............................. 2007-205846

(51) Int. Cl.
*H01L 23/34* (2006.01)
(52) U.S. Cl. ............................. 257/712; 257/E23.103
(58) Field of Classification Search ......... 257/706–712, 257/E23.103
See application file for complete search history.

(56) References Cited

U.S. PATENT DOCUMENTS

| | | | | |
|---|---|---|---|---|
| 7,298,043 B2 * | 11/2007 | Yui | ............................. | 257/713 |
| 7,332,820 B2 * | 2/2008 | Tan et al. | ..................... | 257/777 |
| 7,344,296 B2 * | 3/2008 | Matsui et al. | ............... | 362/652 |
| 7,357,173 B2 * | 4/2008 | Griesmayer | ................ | 165/80.3 |
| 7,359,205 B1 * | 4/2008 | Sun et al. | .................... | 361/719 |
| 7,361,985 B2 * | 4/2008 | Yuan et al. | .................. | 257/713 |
| 7,760,507 B2 * | 7/2010 | Jewram et al. | .............. | 361/713 |
| 2003/0003287 A1 | 1/2003 | Tobita | | |
| 2006/0181860 A1 | 8/2006 | Larson | | |

FOREIGN PATENT DOCUMENTS

| | | |
|---|---|---|
| JP | 9-129793 | 5/1997 |
| JP | 2001-118974 | 4/2001 |
| JP | 2001-313345 | 11/2001 |
| JP | 2004-76044 | 3/2004 |
| JP | 2004-288949 | 10/2004 |
| JP | 2005-255503 | 9/2005 |
| JP | 2005-272164 | 10/2005 |
| JP | 2006-45596 | 2/2006 |
| JP | 2006-93526 | 4/2006 |
| JP | 2006-114826 | 4/2006 |
| JP | 2006-144030 | 6/2006 |
| JP | 2006-290736 | 10/2006 |

(Continued)

OTHER PUBLICATIONS

U.S. Appl. No. 12/579,023, filed Oct. 14, 2009, Takagi, et al.

(Continued)

*Primary Examiner*—Nathan W Ha
(74) *Attorney, Agent, or Firm*—Oblon, Spivak, McClelland, Maier & Neustadt, L.L.P.

(57) ABSTRACT

A semiconductor package includes a base plate having first and second surfaces both facing in opposite directions, and a plurality of anisotropic heat conducting members disposed in the base plate and spaced away from each other. A semiconductor element having a heat generating unit is mounted on the first surface, and the second surface is supported on a supporting member having a thermal conductivity. Each anisotropic heat conducting member has a sheet shape intersecting with the first and second surfaces, and orientates a direction of higher thermal conductivity than the thermal conductivity of the base plate in a direction from the first surface toward the second surface.

20 Claims, 6 Drawing Sheets

FOREIGN PATENT DOCUMENTS

| | | |
|---|---|---|
| JP | 2006-310806 | 11/2006 |
| JP | 2007-12911 | 1/2007 |
| JP | 2007-59875 | 3/2007 |
| WO | WO 2006/088065 A1 | 8/2006 |
| WO | WO 2006/118032 A1 | 11/2006 |
| WO | WO 2006/134858 A1 | 12/2006 |

OTHER PUBLICATIONS

U.S. Appl. No. 12/252,072, filed Oct. 15, 2008, Hasegawa.
U.S. Appl. No. 12/274,582, filed Nov. 20, 2008, Hasegawa.
U.S. Appl. No. 12/533,494, filed Jul. 31, 2009, Hasegawa.

* cited by examiner

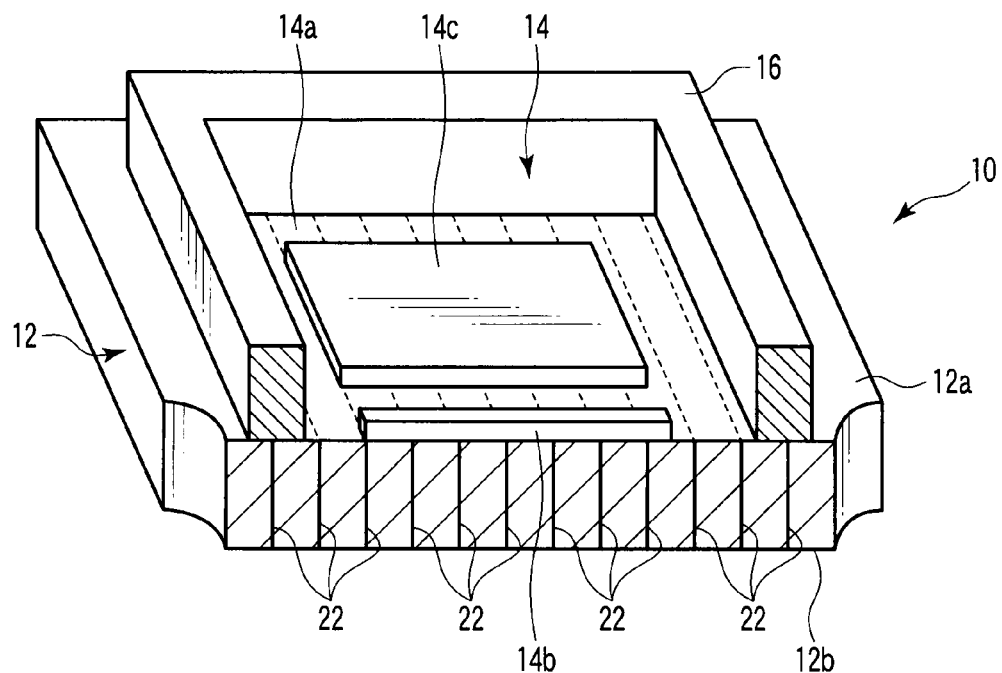
F I G. 2
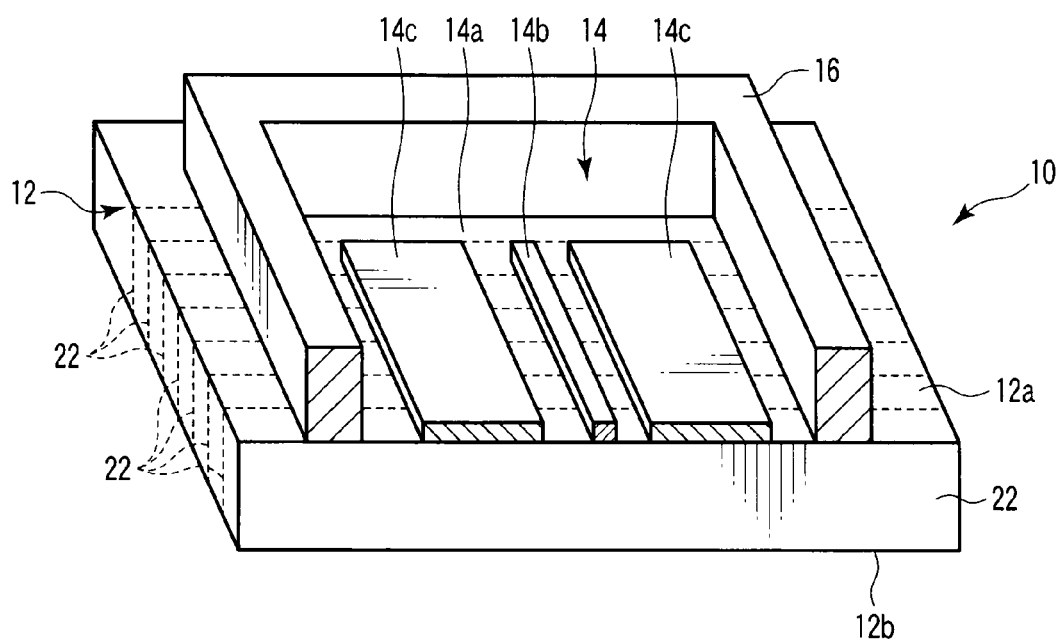
F I G. 3

SEMICONDUCTOR PACKAGE

CROSS-REFERENCE TO RELATED APPLICATIONS

This application is based upon and claims the benefit of priority from prior Japanese Patent Application No. 2007-205846, filed Aug. 7, 2007, the entire contents of which are incorporated herein by reference.

BACKGROUND OF THE INVENTION

1. Field of the Invention

The present invention relates to a semiconductor package.

2. Description of the Related Art

A conventional semiconductor package comprises a base plate formed of a material high in thermal conductivity, for example, copper or copper alloy, and having a flat first surface and a flat second surface facing in the opposite direction to the first surface, and a semiconductor element mounted in a predetermined region on the flat first surface of the base plate. The second surface of the base plate is supported in a predetermined position on a supporting member. The supporting member is also made of a metal material relatively high in thermal conductivity, but not so high as that of the base plate, such as aluminum or iron.

The semiconductor element includes a semiconductor substrate made of, for example, silicon and mounted in the predetermined region on the first surface of the base plate, a heat generating unit disposed or formed on the semiconductor substrate and generating a relatively large quantity of heat by operation like, for example, an integrated circuit, and various circuit units disposed or formed around the heat generating unit on the semiconductor substrate. The various circuit units include printed wirings electrically connected to the heat generating unit and generate only very small quantity of heat as compared with the heat generated by the heat generating unit in operation. The various circuit units include a plurality of external connection terminals projecting from the printed wirings and the first surface of the base plate.

The predetermined region on the first surface of the base plate is surrounded by a frame member, and an opening of the frame member on the opposite side of the first surface is closed by a lid. The plurality of external connection terminals of the semiconductor element penetrate through the frame member and are exposed to an external space.

When electric signals are input to the plurality of external connection terminals of the semiconductor element, the heat generating unit and various circuit units of the semiconductor element operate and generate heat. The heat is radiated to an external space through a region excluding the second surface on the outer surface of the base plate or is diffused to the supporting member through the second surface of the base plate.

Along with the recent trend in which the performance of the semiconductor element becomes higher, the quantity of heat generated in the heat generating unit is increasing steeply. The semiconductor element cannot exhibit its predetermined performance when its temperature exceeds a predetermined value. Recently, therefore, the base plate is provided with various cooling measures in order to enhance the heat radiation effect from the base plate.

These conventional various cooling measures includes, for example, a direct attachment of a heat sink having a plurality of cooling fins to the second surface of the base plate or a combination of a high heat conductive element of a material having a higher thermal conductivity than that of the base plate, such as a graphite sheet, and adhered to the second surface and the heat sink additionally mounted on the high heat conductive element. The graphite sheet combined with the heat sink and adhered to the second surface is disclosed in, for example, Japanese Patent Application KOKAI Publication No. 2004-288949.

In such conventional cooling measures, the heat generated by the heat generating unit of the semiconductor element on the first surface is transferred to the second surface in the base plate, and is positively discharged from the second surface by means of the heat sink.

Considering, however, the present development scene of semiconductor elements, that is, the degree of increasing of heat density caused by progress of performance and reduction of outer size, it is desired to develop cooling measures having higher cooling performance than that of the conventional cooling measures for ensuring the predetermined high performance of recent advanced semiconductor elements.

BRIEF SUMMARY OF THE INVENTION

According to one aspect of this invention, a semiconductor package comprises a base plate having first and second surfaces both facing in opposite directions, and a plurality of anisotropic heat conducting members disposed in the base plate and spaced away from each other. A semiconductor element having a heat generating unit is mounted on the first surface, and the second surface is supported on a supporting member having a thermal conductivity. Each anisotropic heat conducting member has a sheet shape intersecting with the first and second surfaces, and orientates a direction of higher thermal conductivity than the thermal conductivity of the base plate in a direction from the first surface toward the second surface.

BRIEF DESCRIPTION OF THE SEVERAL VIEWS OF THE DRAWING

The accompanying drawings, which are incorporated in and constitute a part of the specification, illustrate several embodiments of this invention, and together with the general description given above and the detailed description of the embodiments given below, serve to explain the principles of this invention.

FIG. 2 is a schematic sectional view along a line II-II of FIG. 1;

FIG. 3 is a schematic sectional view along a line III-III of FIG. 1;

DETAILED DESCRIPTION OF THE INVENTION

First Embodiment

A semiconductor package 10 according to a first embodiment of this invention will be described in detail with reference to FIGS. 1 to 3.

Figure 1:
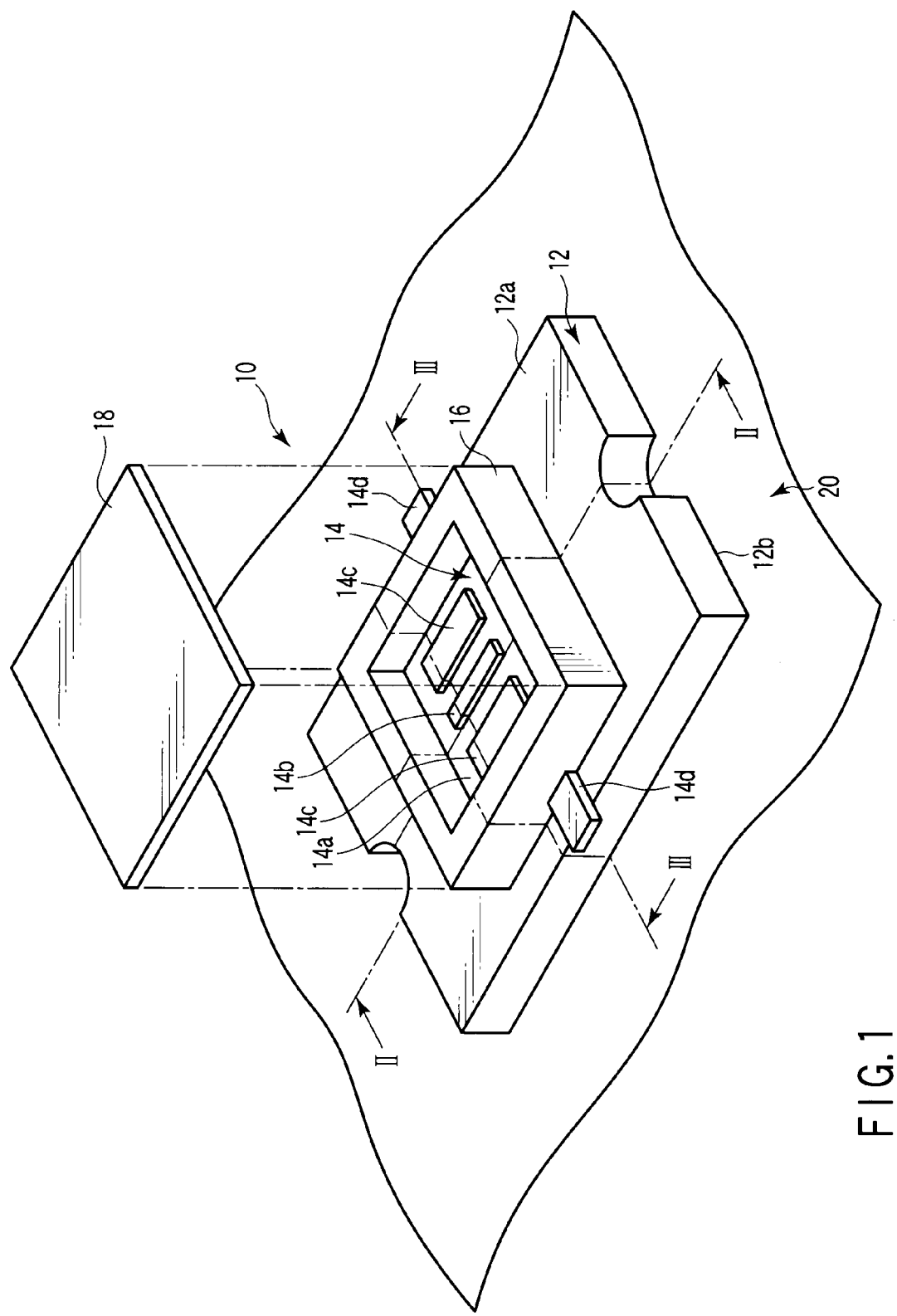
FIG. 1 is a perspective exploded view schematically showing a semiconductor package according to a first embodiment of this invention.

As shown in FIG. 1, the semiconductor package 10 comprises a base plate 12 including a flat first surface 12a and a flat second surface 12b facing in a direction opposite to the first surface 12a. The base plate 12 is formed of a material which is high in thermal conductivity, for example, copper or copper alloy.

A semiconductor element 14 is mounted at a predetermined region on the flat first surface 12a of the base plate 12. The semiconductor element 14 includes a semiconductor substrate 14a which is made of, for example, silicon and which is mounted at the predetermined region on the first surface 12a of the base plate 12, a heat generating unit 14b which generates a relatively large quantity of heat by operation like, for example, an integrated circuit and which is disposed or formed on the semiconductor substrate 14a, and various circuit units 14c which are disposed or formed around the heat generating unit 14b on the semiconductor substrate 14a. The various circuit units 14c include printed wirings (not shown) electrically connected to the heat generating unit 14b and generate only very small quantity of heat as compared with the heat generated by the heat generating unit 14b in operation. The various circuit units 14c include a plurality of external connection terminals 14d which project from the printed wirings and the first surface 12a of the base plate 12.

The predetermined region on the first surface 12a of the base plate 12 is surrounded by a frame member 16, and an opening of the frame member 16 on the opposite side of the first surface 12a is closed by a lid 18. The plurality of external connection terminals 14d of the semiconductor element 14 penetrate through the frame member 16 and are exposed to an external space.

An outer surface of the semiconductor package 10 is covered with a high-frequency current resistant material such as gold. Such covering is achieved by, for example, plating of the high-frequency current resistant material.

The base plate 12 is detachably supported at a predetermined position on a supporting member 20 by means of a well known fixing element not shown, such as a plurality of fixing screws, while contacting the second surface 12b of the base plate 12 with the predetermined position on the supporting member 20. The supporting member 20 is also made of a metal material relatively high in thermal conductivity, but not so high as that of the base plate 12, such as aluminum or iron.

The supporting member 20 may be a well known heat sink, and the well known heat sink may be an air-cooled structure or a liquid-cooled structure.

As shown in FIGS. 2 and 3, a plurality of anisotropic heat conducting members 22 each having a sheet shape are disposed in the base plate 12 so that the anisotropic heat conducting members 22 intersect with the first surface 12a and the second surface 12b and are spaced from each other. Each anisotropic heat conducting member 22 orientates its higher thermal conductivity than the thermal conductivity of the base plate 12 in a direction from the first surface 12a toward the second surface 12b of the base plate 12.

The majority of the plurality of anisotropic heat conducting members 22 intersects with the predetermined region enclosed by the frame member 16 on the first surface 12a of the base plate 12, that is, the region where the semiconductor substrate 14a of the semiconductor element 14 is mounted.

In this embodiment, each anisotropic heat conducting member 22 includes graphite sheet.

At least a part of the plurality of anisotropic heat conducting members 22 intersects with the heat generating unit 14b of the semiconductor element 14 on the first surface 12a.

In this embodiment, the heat generating unit 14b of the semiconductor element 14 has a slender shape along the first surface 12a of the base plate 12. At least a part of the plurality of anisotropic heat conducting members 22 intersects with the heat generating unit 14c of the semiconductor element 14 on the first surface 12a in a direction orthogonal to the longitudinal direction of the heat generating unit 14c.

The base plate 12 in which the plurality of anisotropic heat conducting members 22 are disposed in the predetermined layout as described above can be manufactured easily by a well known manufacturing method. For example, while the plurality of anisotropic heat conducting members 22 are disposed in the predetermined layout in a molding space (not shown) for the base plate 12 contained in a molding member (not shown), fine powder material for the base plate 12 is sequentially deposited in the molding space under a predetermined pressure.

In the semiconductor package 10 according to the first embodiment of this invention and configured as described above in detail, when predetermined electric signals are input to the plurality of external connection terminals 14b of the semiconductor element 14, the heat generating unit 14b and various circuit units 14c of the semiconductor element 14 operate and generate heat. The majority of the heat is promptly transmitted from the predetermined region on which the heat generating unit 14b and various circuit units 14c of the semiconductor element 14 are mounted, on the first surface 12a of the base plate 12 to the second surface 12b by the plurality of anisotropic heat conducting members 22, and is diffused into the supporting member 20 through the second surface 12a of the base plate 12.

The remaining heat is radiated into an external space through a region excluding the second surface 12b on the outer surface of the base plate 12.

Second Embodiment

Figure 4:
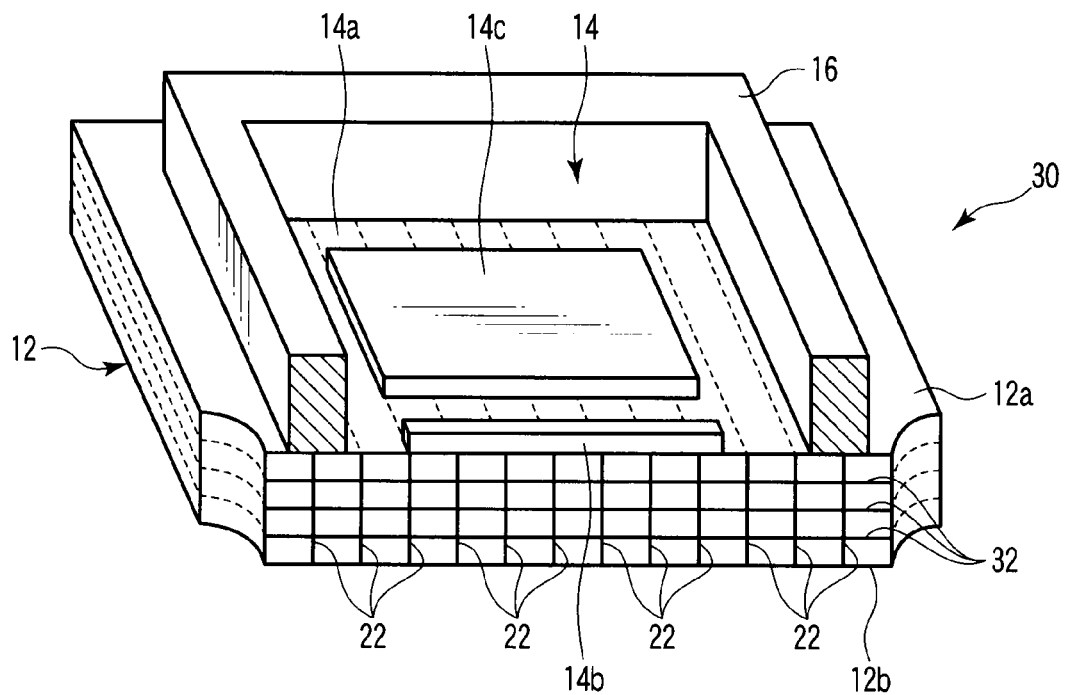
FIG. 4 is a schematic sectional view of a semiconductor package according to a second embodiment of this invention, which is like FIG. 2.
Figure 5:
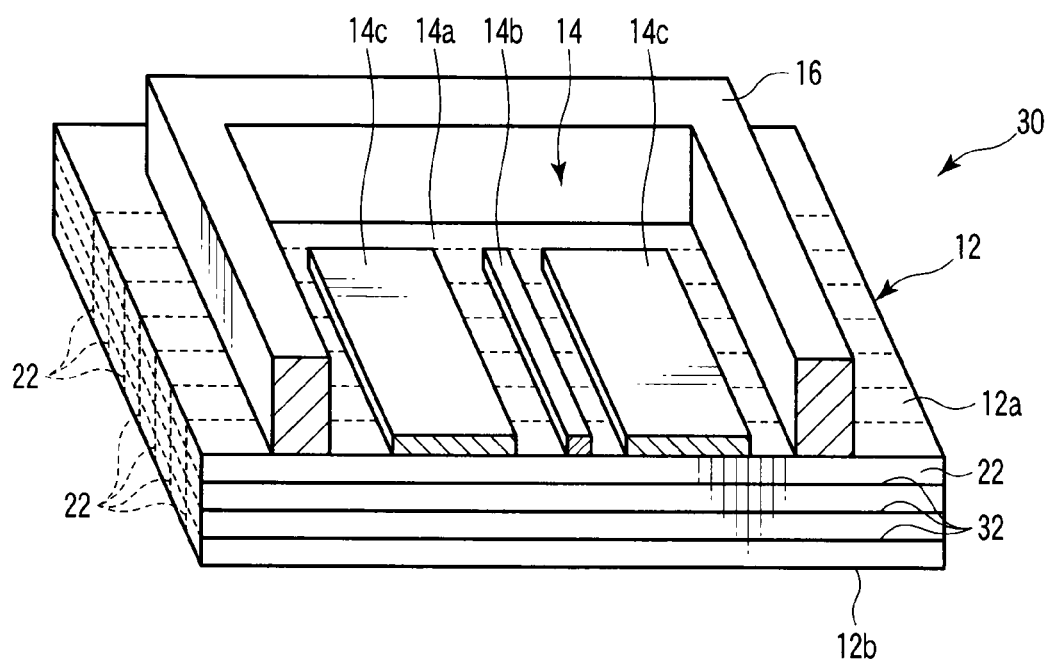
FIG. 5 is a schematic sectional view of the semiconductor package according to the second embodiment of this invention, which is like FIG. 3.

Next, a semiconductor package 30 according to a second embodiment of this invention will be described in detail with reference to FIGS. 4 and 5. FIG. 4 is a schematic sectional view of the semiconductor package 30 according to the second embodiment of the invention, which is like FIG. 2; and FIG. 5 is a schematic sectional view of the semiconductor package 30 according to the second embodiment of the invention, which is like FIG. 3.

The most structural members of the semiconductor package 30 are the same as those of the semiconductor package 10 according to the first embodiment of this invention and described above with reference to FIGS. 1 to 3. Therefore, the structural members of the semiconductor package 30 which are the same as those of the semiconductor package 10 are denoted by the same reference numerals denoting the same structural members of the semiconductor package 10, and detailed explanation of them are omitted.

The semiconductor package 30 of the second embodiment differs from the semiconductor package 10 of the first embodiment in that at least one thermal expansion control layer 32 is disposed along the first surface 12a between the first surface 12a and the second surface 12b in the base plate 12. The thermal expansion control layer 32 is formed of a material having a coefficient of thermal expansion substantially equivalent to that of the heat generating unit 14b of the semiconductor element 14. The thermal expansion control layer 32 securely prevents the semiconductor substrate 14a and the circuit units 14c including the printed wirings (not shown) and provided on the semiconductor substrate 14a from cracking while the coefficient of thermal expansion of the heat generating unit 14b is different from the coefficient of thermal expansion of the base plate 12 and the heat generating unit 14b generates heat of large quantity. The thermal expansion control layer 32 further prevents the base plate 12 from being distorted, so that a gap is not formed between the second surface 12b of the base plate 12 and the supporting member 20 (see FIG. 1) and a good heat transfer efficiency between the second surface 12b of the base plate 12 and the supporting member 20 (see FIG. 1) is maintained.

The material for such thermal expansion control layer 32 is well known, and, for example, carbon cloth or molybdenum may be used. The thermal expansion control layer 32 can be disposed in the base plate 12 by the same manufacturing method as for the base plate 12 containing the plurality of anisotropic heat conducting members 22 in the semiconductor package 10 according to the first embodiment.

Third Embodiment

Figure 6:
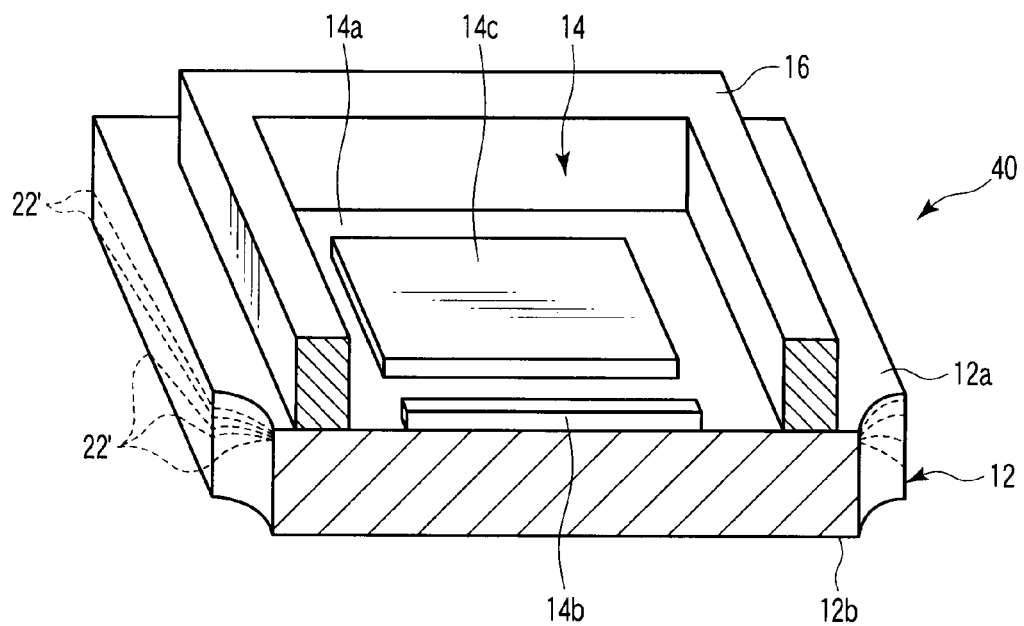
FIG. 6 is a schematic sectional view of a semiconductor package according to a third embodiment of this invention, which is like FIG. 2.
Figure 7:
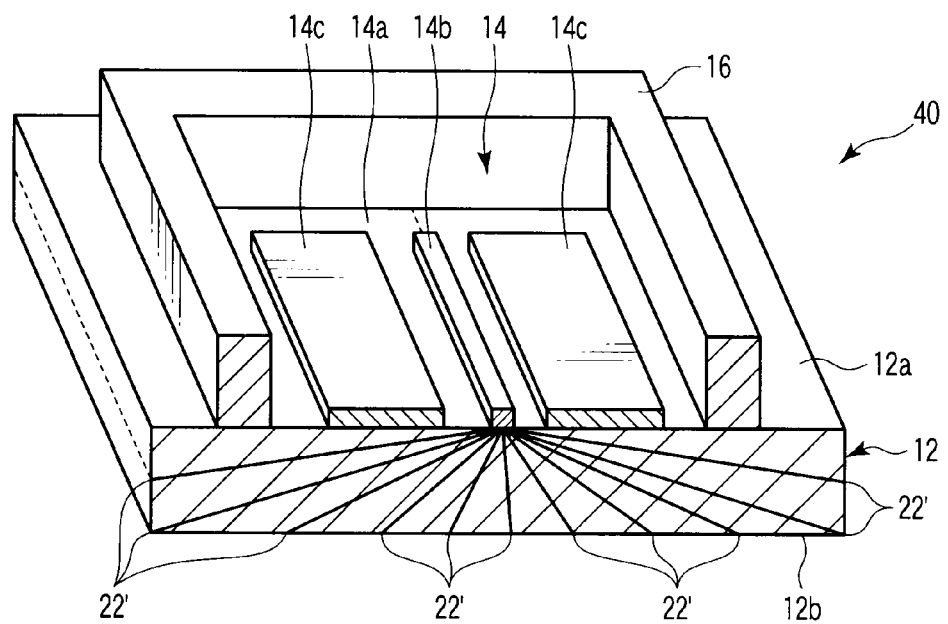
FIG. 7 is a schematic sectional view of the semiconductor package according to the third embodiment of this invention, which is like FIG. 3.

Next, a semiconductor package 40 according to a third embodiment of this invention will be described in detail with reference to FIGS. 6 and 7. FIG. 6 is a schematic sectional view of the semiconductor package 40 according to the third embodiment of the invention, which is like FIG. 2; and FIG. 7 is a schematic sectional view of the semiconductor package 40 according to the third embodiment of the invention, which is like FIG. 3.

The most structural members of the semiconductor package 40 are the same as those of the semiconductor package 10 according to the first embodiment of this invention and described above with reference to FIGS. 1 to 3. Therefore, the structural members of the semiconductor package 40 which are the same as those of the semiconductor package 10 are denoted by the same reference numerals denoting the same structural members of the semiconductor package 10, and detailed explanation of them are omitted.

The semiconductor package 40 of the third embodiment differs from the above described semiconductor package 10 of the first embodiment in the layout of a plurality of anisotropic heat conducting members 22' in the base plate 12.

The plurality of anisotropic heat conducting members 22' of the semiconductor package 40 are similar to the plurality of anisotropic heat conducting members 22 of the semiconductor package 10 in the first embodiment. That is, the plurality of anisotropic heat conducting members 22' each having a sheet shape are disposed in the base plate 12 so that the anisotropic heat conducting members 22' intersect with the first surface 12a and the second surface 12b and are spaced from each other. Each anisotropic heat conducting member 22' orientates its higher thermal conductivity than the thermal conductivity of the base plate 12 in a direction from the first surface 12a toward the second surface 12b of the base plate 12.

However, at least a part of the plurality of anisotropic heat conducting members 22' of the semiconductor package 40 intersects with the slender heat generating unit 14a of the semiconductor element 14 on the first surface 12a in a direction along the longitudinal direction of the heat generating unit 14a.

Moreover, the anisotropic heat conducting members 22' are spaced away from each other in parallel while extending from the heat generating unit 14b of the semiconductor element 14 on the first surface 12a toward the second surface 12b. This means that, in the semiconductor package 40 of this embodiment, when the base plate 12 is cut in a direction orthogonal to the longitudinal direction of the slender heat generating unit 14b as shown in FIG. 7, the anisotropic heat conducting members 22' are arranged radially toward the second surface 12b from the heat generating unit 14b of the first surface 12b.

In such configuration, heat generated from the heat generating unit 14b which generates the maximum quantity of heat in the semiconductor element 14 on the first surface 12a of the base plate 12 can be diffused efficiently to the second surface 12b. That is, the large quantity of heat generated in the heat generating unit 14b of the semiconductor element 14 on the first surface 12a of the base plate 12 can be efficiently transmitted to the supporting member 20 (see FIG. 1) through the second surface 12b of the base plate 12.

The plurality of anisotropic heat conducting members 22' can be disposed in the base plate 12 by the same material and the same manufacturing method as those for the plurality of anisotropic heat conducting members 22 of the semiconductor package 10 in the first embodiment.

Also in this embodiment, as in the semiconductor package 30 of the second embodiment described above with reference to FIGS. 4 and 5, at least one of a plurality of thermal expansion control layers 32 can be disposed in the base plate 12, so that the semiconductor package 40 of this embodiment can enjoy a desired function which can be obtained from the thermal expansion control layer 32.

Fourth Embodiment

Figure 8:
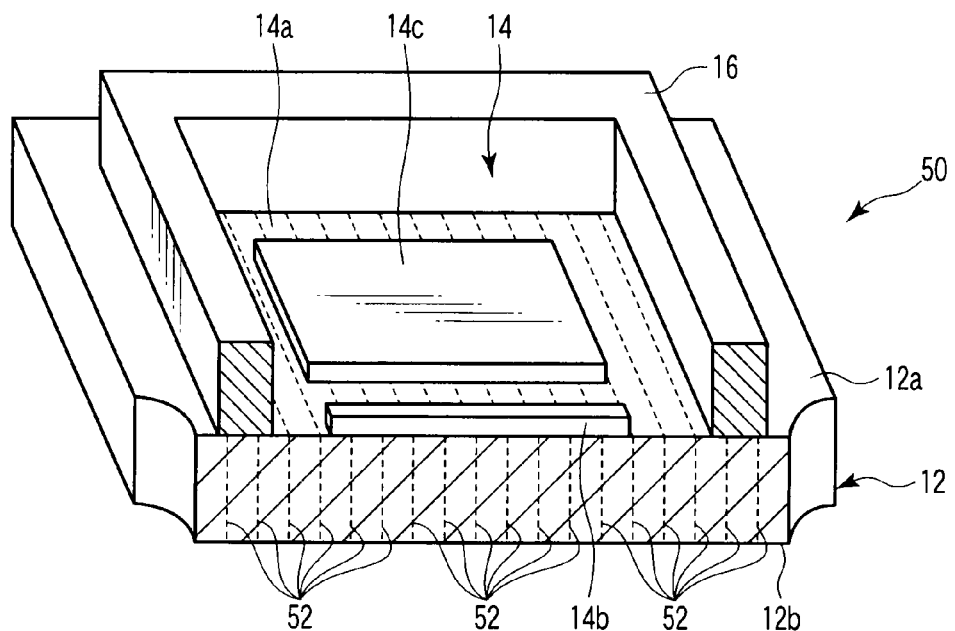
FIG. 8 is a schematic sectional view of a semiconductor package according to a fourth embodiment of this invention, which is like FIG. 2.

Next, a semiconductor package 50 according to a fourth embodiment of this invention will be described in detail with reference to FIG. 8. FIG. 8 is a schematic sectional view of the semiconductor package 50 according to the fourth embodiment of the invention, which is like FIG. 2.

The most structural members of the semiconductor package 50 are the same as those of the semiconductor package 10 according to the first embodiment of this invention and described above with reference to FIGS. 1 to 3. Therefore, the structural members of the semiconductor package 50 which are the same as those of the semiconductor package 10 are denoted by the same reference numerals denoting the same structural members of the semiconductor package 10, and detailed explanation of them are omitted.

The semiconductor package 50 of the fourth embodiment differs from the semiconductor package 10 of the first embodiment in the material of a plurality of anisotropic heat conducting members 52 in the base plate 12. Each anisotropic heat conducting member 52 includes a plurality of carbon nanotubes which are configured to a sheet shape.

The plurality of anisotropic heat conducting members 52 of the semiconductor package 50 are similar to the plurality of anisotropic heat conducting members 22 of the semiconductor package 10 of the first embodiment. That is, the plurality of anisotropic heat conducting members 52 each having a sheet shape are disposed in the base plate 12 so that the anisotropic heat conducting members 52 intersect with the first surface 12a and the second surface 12b and are spaced from each other. Each anisotropic heat conducting member 52 orientates its higher thermal conductivity than the thermal conductivity of the base plate 12 in a direction from the first surface 12a toward the second surface 12b of the base plate 12. Moreover, like in the plurality of anisotropic heat conducting members 22 of the semiconductor package 10 of the first embodiment, at least a part of the plurality of the anisotropic heat conducting members 52 intersects with the slender heat generating unit 14a of the semiconductor element 14 on the first surface 12a of the base plate 12 in a direction orthogonal to the longitudinal direction of the heat generating unit 14a.

The plurality of anisotropic heat conducting members 52 can be disposed in the base plate 12 by the same manufacturing method as for the plurality of anisotropic heat conducting members 22 of the semiconductor package 10 in the first embodiment. The plurality of anisotropic heat conducting members 52 functions in the same way as the plurality of anisotropic heat conducting members 22 of the semiconductor package 10 in the first embodiment and can enjoy the same performance.

Fifth Embodiment

Figure 9:
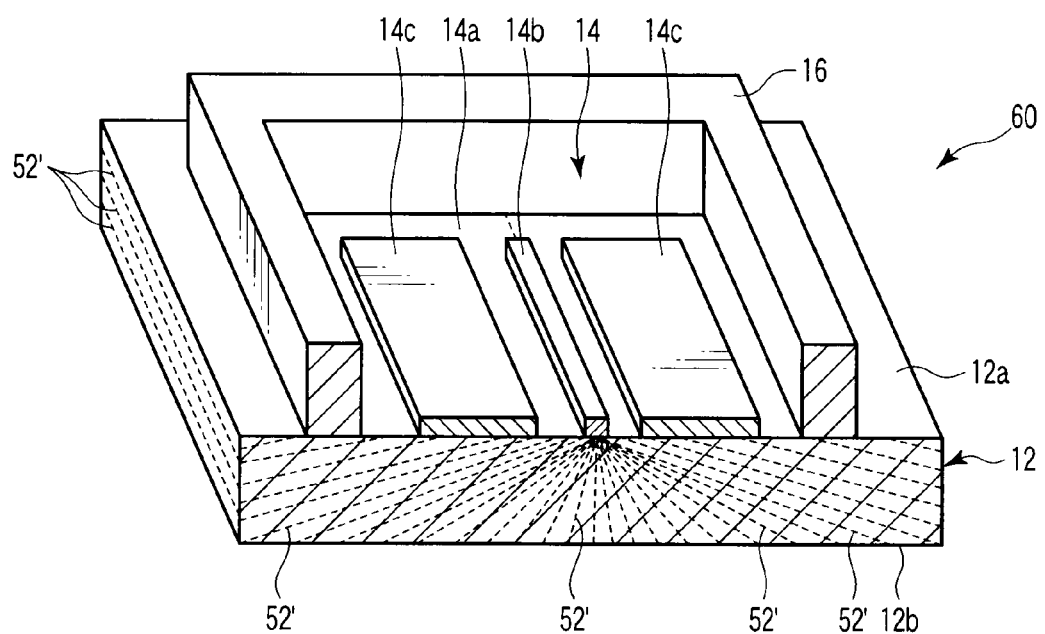
FIG. 9 is a schematic sectional view of a semiconductor package according to a fifth embodiment of this invention, which is like FIG. 3.

Next, a semiconductor package 60 according to a fifth embodiment of this invention will be described in detail with reference to FIG. 9. FIG. 9 is a schematic sectional view of the semiconductor package 60 according to the fifth embodiment of the invention, which is like FIG. 3.

The most structural members of the semiconductor package 60 are the same as those of the semiconductor package 10 according to the first embodiment of this invention and described above with reference to FIGS. 1 to 3. Therefore, the structural members of the semiconductor package 60 which are the same as those of the semiconductor package 10 are denoted by the same reference numerals denoting the same structural members of the semiconductor package 10, and detailed explanation of them are omitted.

The semiconductor package 60 of the fifth embodiment differs from the semiconductor package 10 of the first embodiment in the material of a plurality of anisotropic heat conducting members 52' in the base plate 12. Each anisotropic heat conducting member 52' includes a plurality of carbon nanotubes which are configured to a sheet shape.

The plurality of anisotropic heat conducting members 52' of the semiconductor package 60 are similar to the plurality of anisotropic heat conducting members 22 of the semiconductor package 10 of the first embodiment. That is, the plurality of anisotropic heat conducting members 52' each having a sheet shape are disposed in the base plate 12 so that the anisotropic heat conducting members 52' intersect with the first surface 12a and the second surface 12b and are spaced from each other. Each anisotropic heat conducting member 52' orientates its higher thermal conductivity than the thermal conductivity of the base plate 12 in a direction from the first surface 12a toward the second surface 12b of the base plate 12. But, like in the plurality of anisotropic heat conducting members 22' of the semiconductor package 40 of the third embodiment described above with reference to FIGS. 6 and 7, at least a part of the plurality of anisotropic heat conducting members 52' of the semiconductor package 60 intersects with the slender heat generating unit 14a of the semiconductor element 14 on the first surface 12a in a direction along the longitudinal direction of the heat generating unit 14a. Moreover, the anisotropic heat conducting members 52' are spaced away from each other in parallel while extending from the heat generating unit 14b of the semiconductor element 14 on the first surface 12a toward the second surface 12b. This means that, in the semiconductor package 60 of this embodiment, when the base plate 12 is cut in a direction orthogonal to the longitudinal direction of the slender heat generating unit 14b as shown in FIG. 9, the anisotropic heat conducting members 52' are arranged radially toward the second surface 12b from the heat generating unit 14b of the first surface 12b.

The plurality of anisotropic heat conducting members 52' can be disposed in the base plate 12 by the same manufacturing method as for the plurality of anisotropic heat conducting members 22 of the semiconductor package 10 in the first embodiment. The plurality of anisotropic heat conducting members 52' function in the same way as the plurality of anisotropic heat conducting members 22' of the semiconductor package 40 in the third embodiment shown in FIGS. 6 and 7 and can enjoy the same performance.

Sixth Embodiment

Figure 10:
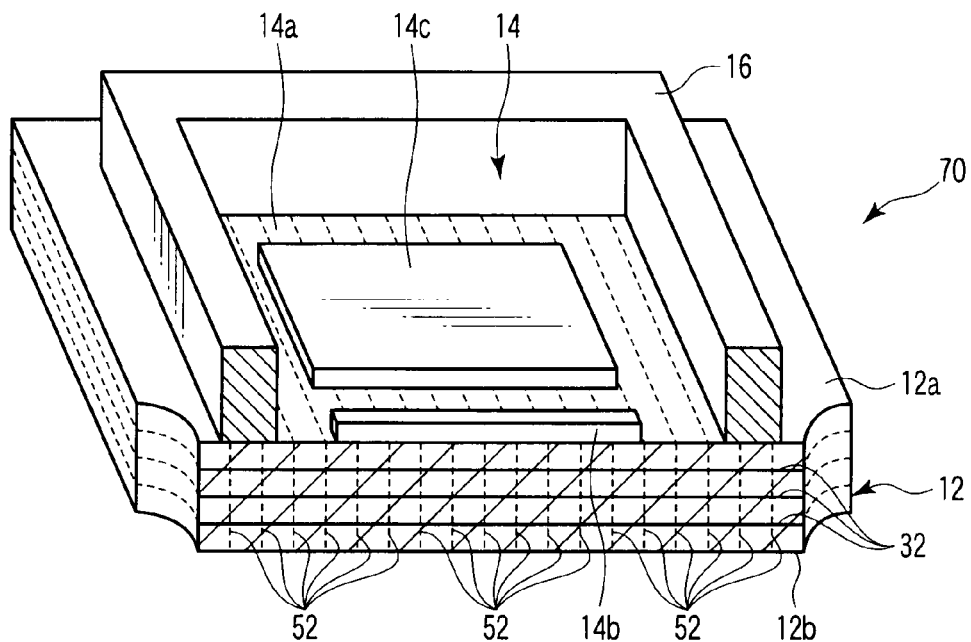
FIG. 10 is a schematic sectional view of a semiconductor package according to a sixth embodiment of this invention, which is like FIG. 2.

Next, a semiconductor package 70 according to a sixth embodiment of this invention will be described in detail with reference to FIG. 10. FIG. 10 is a schematic sectional view of the semiconductor package 70 according to the sixth embodiment of the invention, which is like FIG. 2.

The semiconductor package 70 is configured by combining the structure of the semiconductor package 50 of the fourth embodiment described above with reference to FIG. 8, with a plurality of thermal expansion control layers 32 used in the semiconductor package 30 according to the second embodiment described above with reference to FIGS. 4 and 5.

Therefore, the semiconductor package 70 enjoys both the performance exhibited by the semiconductor package 50 of the fourth embodiment described above with reference to FIG. 8 and the performance exhibited by the plurality of thermal expansion control layers 32 used in the semiconductor package 30 of the second embodiment described above with reference to FIGS. 4 and 5.

Seventh Embodiment

Figure 11:
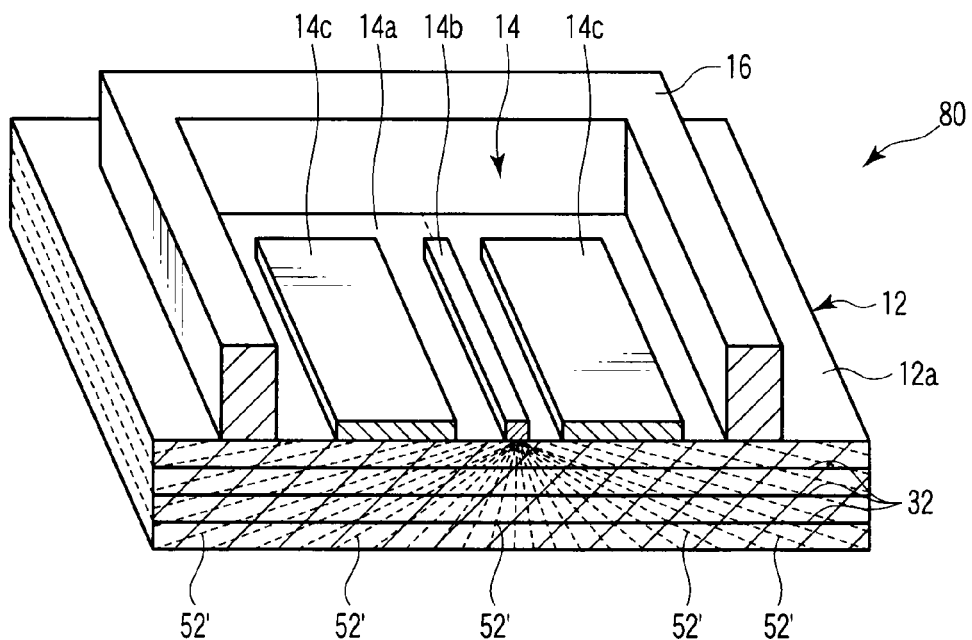
FIG. 11 is a schematic sectional view of a semiconductor package according to a seventh embodiment of this invention, which is like FIG. 3.

Next, a semiconductor package 80 according to a seventh embodiment of this invention will be described in detail with reference to FIG. 11. FIG. 11 is a schematic sectional view of the semiconductor package 80 according to the seventh embodiment of this invention, which is like FIG. 3.

The semiconductor package 80 is configured by combining the semiconductor package 60 according to the fifth embodiment described above with reference to FIG. 9, with a plurality of thermal expansion control layers 32 used in the semiconductor package 30 of the second embodiment described above with reference to FIGS. 4 and 5.

Therefore, the semiconductor package 80 enjoys both the performance exhibited by the semiconductor package 60 of the fifth embodiment described above with reference to FIG. 9 and the performance exhibited by the plurality of thermal expansion control layers 32 used in the semiconductor package 30 of the second embodiment described above with reference to FIGS. 4 and 5.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor package comprising:
    a base plate including a first surface on which a semiconductor element having a heat generating unit is mounted, and a second surface facing in the opposite direction to the first surface and supported on a supporting member having a thermal conductivity; and
    a plurality of anisotropic heat conducting members disposed in the base plate and spaced away from each other, each having a sheet shape intersecting with the first surface and the second surface, and each orientating a direction of higher thermal conductivity than the thermal conductivity of the base plate in a direction from the first surface toward the second surface.

2. The semiconductor package according to claim 1, wherein each of the plurality of anisotropic heat conducting members includes a graphite sheet.

3. The semiconductor package according to claim 1, wherein each of the plurality of anisotropic heat conducting members includes a plurality of carbon nanotubes.

4. The semiconductor package according to claim 1, further comprising a thermal expansion control layer having substantially the same coefficient of thermal expansion as that of the heat generating unit of the semiconductor element and disposed along the first surface between the first surface and the second surface in the base plate.

5. The semiconductor package according to claim 1, wherein at least a part of the plurality of anisotropic heat conducting members intersects with the heat generating unit of the semiconductor element on the first surface.

6. The semiconductor package according to claim 5, wherein the heat generating unit of the semiconductor element has a slender shape along the first surface of the base plate, and
    at least a part of the plurality of anisotropic heat conducting members intersects with the heat generating unit of the semiconductor element on the first surface in a direction orthogonal to a longitudinal direction of the heat generating unit.

7. The semiconductor package according to claim 5, wherein the heat generating unit of the semiconductor element has a slender shape along the first surface of the base plate, and
    at least a part of the plurality of anisotropic heat conducting members intersects with the heat generating unit of the semiconductor element on the first surface in a direction along a longitudinal direction of the heat generating unit.

8. The semiconductor package according to claim 7, wherein the anisotropic heat conducting members are spaced away from each other in parallel while extending from the heat generating unit of the semiconductor element on the first surface to the second surface.

9. The semiconductor package according to claim 5, wherein each of the plurality of anisotropic heat conducting members includes a graphite sheet.

10. The semiconductor package according to claim 5, wherein each of the plurality of anisotropic heat conducting members includes a plurality of carbon nanotubes.

11. The semiconductor package according to claim 1, further comprising a thermal expansion control layer having substantially the same coefficient of thermal expansion as that of the heat generating unit of the semiconductor element and disposed along the first surface between the first surface and the second surface in the base plate,
    wherein at least a part of the plurality of anisotropic heat conducting members intersects with the heat generating unit of the semiconductor element on the first surface.

12. The semiconductor package according to claim 11, wherein the heat generating unit of the semiconductor element has a slender shape along the first surface of the base plate, and
    at least a part of the plurality of anisotropic heat conducting members intersects with the heat generating unit of the semiconductor element on the first surface in a direction orthogonal to a longitudinal direction of the heat generating unit.

13. The semiconductor package according to claim 11, wherein the heat generating unit of the semiconductor element has a slender shape along the first surface of the base plate, and
    at least a part of the plurality of anisotropic heat conducting members intersects with the heat generating unit of the semiconductor element on the first surface in a direction along a longitudinal direction of the heat generating unit.

14. The semiconductor package according to claim 13, wherein the anisotropic heat conducting members are separated from each other in parallel while extending from the heat generating unit of the semiconductor element of the first surface to the second surface.

15. The semiconductor package according to claim 11, wherein each of the plurality of anisotropic heat conducting members includes a graphite sheet.

16. The semiconductor package according to claim 15, wherein the heat generating unit of the semiconductor element has a slender shape along the first surface of the base plate, and
    at least a part of the plurality of anisotropic heat conducting members intersects with the heat generating unit of the semiconductor element on the first surface in a direction orthogonal a longitudinal direction of the heat generating unit.

17. The semiconductor package according to claim 15, wherein the heat generating unit of the semiconductor element has a slender shape along the first surface of the base plate,
    at least a part of the plurality of anisotropic heat conducting members intersects with the heat generating unit of the semiconductor element on the first surface in a direction along a longitudinal direction of the heat generating unit, and
    the anisotropic heat conducting members are separated from each other in parallel while extending from the heat generating unit of the semiconductor element of the first surface to the second surface.

18. The semiconductor package according to claim 11, wherein each of the plurality of anisotropic heat conducting members includes a plurality of carbon nanotubes.

19. The semiconductor package according to claim 18, wherein the heat generating unit of the semiconductor element has a slender shape along the first surface of the base plate, and at least a part of the plurality of anisotropic heat conducting members intersects with the heat generating unit of the semiconductor element on the first surface in a direction orthogonal to a longitudinal direction of the heat generating unit.

20. The semiconductor package according to claim 18, wherein the heat generating unit of the semiconductor element has a slender shape along the first surface of the base plate, at least a part of the plurality of anisotropic heat conducting members intersects with the heat generating unit of the semiconductor element on the first surface in a direction along a longitudinal direction of the heat generating unit, and the anisotropic heat conducting members are spaced apart from each other in parallel while extending from the heat generating unit of the semiconductor element of the first surface to the second surface.

* * * * *